United States Patent [19]
Firooz et al.

[11] Patent Number: 4,799,023
[45] Date of Patent: Jan. 17, 1989

[54] CIRCUITS AND APPARATUS WHICH ENABLE ELIMINATION OF SETUP TIME AND HOLD TIME TESTING ERRORS

[75] Inventors: Kamran Firooz; Vance R. Harwood; Robert C. Illick, Jr.; David T. Crook, all of Loveland, Colo.

[73] Assignee: Hewlett-Packard Company, Palo Alto, Calif.

[21] Appl. No.: 753,366

[22] Filed: Jul. 5, 1985

Related U.S. Application Data

[63] Continuation of Ser. No. 318,529, Nov. 5, 1981, abandoned.

[51] Int. Cl.⁴ .................. H03K 5/22; G01R 15/12
[52] U.S. Cl. .................... 328/110; 307/234; 324/73 R
[58] Field of Search ........... 324/73 R, 73 AT, 73 PC; 307/234, 510, 517, ; 328/109, 110

[56] References Cited

U.S. PATENT DOCUMENTS 4,237,423 12/1980 Rhodes .............................. 320/110

Primary Examiner—Reinhard J. Eisenzopf
Assistant Examiner—Walter E. Snow
Attorney, Agent, or Firm—John A. Frazzini

[57] ABSTRACT

An improved digital testing device is presented which includes the capability to detect and avoid a pair of common sources of measurement error. One source of error occurs when measurements are made within a Setup time before a transition in the signal under test or during a Hold time after such a transition. This device includes the ability to detect when this occurs and to insert a relative delay between the measurements and transitions to eliminate such errors. The device also detects the existence of a 3-state condition of a point of the circuit under test during the period of a measurement and provides an output indication when such occurs.

6 Claims, 4 Drawing Sheets

CIRCUITS AND APPARATUS WHICH ENABLE ELIMINATION OF SETUP TIME AND HOLD TIME TESTING ERRORS

CROSS REFERENCE TO RELATED APPLICATION

This application is a continuation of application Ser. No. 318,529, filed Nov. 5, 1981, now abandoned.

BACKGROUND OF THE INVENTION

The qualitative difference between the type of signals present in digital devices and the type of signals present in analog devices has led to the development of a number of techniques for testing digital devices. Typically, these testing techniques apply a set of test signals to various points of the circuit and then observe the digital data stream produced at one or more test points. For example, FIG. 7 shows a 2-input AND gate, a pair of input signals to test the operation of the AND gate, and the correct output signal at its output port corresponding to the displayed test input signals. This AND gate is tested by observing the digital data stream produced at its output port and comparing this observed data stream with that corresponding to a good (i.e. properly functioning) AND gate.

In complex circuits, the data stream must be observed at a number of test points and each of these data streams will typically contain many more bits than the 4 bit data stream of the example in FIG. 7. Because of the large amount of test data generated in a test of a typical digital device, many of the test techniques process the data streams to produce output data which is more easily used by the person performing the test. In one scheme known as transition counting, the test device produces for each data stream a number representing the number of times its associated data stream made a low-to-high or high-to-low transition.

In another digital test scheme known as signature analysis (See U.S. Pat. No. 3,976,864 entitled "Apparatus and Method for Testing Digital Circuits" issued to Gary B. Gordon et al on Aug. 24, 1976), each data stream is divided by a characteristic polynomial to produce a residue (known as a signature) of significantly shorter length than the data stream. Typically, each signature is chosen to be 16 or 20 bits long so that the residue can be displayed as a 4 or 5 digit display using a hexadecimal character set. Signature analysis is implemented by measuring the signature for each test point of a circuit under test and comparing these signatures with those for a circuit which is known to be good. When these two signature sets are not identical, the circuit under test is considered to be bad. The actual element or elements in the circuit which are bad can often be determined by locating those elements which have input signals with correct signature and yet produce output signals with incorrect signature.

Each of these digital testing techniques relies on the accurate detection of the data stream being observed. One source of possible inaccurate detection of data streams is the occurrence of measurements of the data stream near the times of transitions in the data streams. When this occurs, small variations between circuits can cause a data stream for one unit under test to be detected slightly before such transitions while causing the corresponding data stream for another unit under test to be detected slightly after such transitions. This problem in the testing technique could therefore produce a "bad" signature for a unit under test thereby causing some "good units" to be tested as being bad.

SUMMARY OF THE INVENTION

In general, digital data does not make low-to-high or high-to-low transitions along the square wave curves drawn to represent idealized data streams. These transitions instead occur along curves with finite slope so that there is a non-zero time for such transitions. In addition, such rapid transitions are accompanied by transient oscillations which must decay to a certain level before accurate detection of the digital signal can be performed. As a result of such effects, the accurate measurement of digital data requires that a measurement not be initiated within a short time, known as the Setup time $T_s$, after a data transition. Similarly the measurement process is not instantaneous so that no data transitions should be allowed within a short time, known as the Hold time $T_h$, after a measurement is initiated.

In digital devices, data streams throughout the device are typically generated in synchronism with a clock signal. It is therefore natural to utilize such a clock signal to control the selection of times at which the measurement of data streams in a unit under test are performed. In some test situations the clock signal is produced by the unit under test but in other situations the testing device provides the clock signal. The clock signal is usually periodic, but in some cases it can be aperiodic. For example, in the a synchronous interface HP-IB defined by IEEE standard 488, data is transmitted a synchronously and one of the data lines carries a signal DAV which defines when the data on the other data lines is valid. Therefore, in testing the operation of such an interface, the DAV signal can be utilized as the signal controlling the selection of measurement times. In general, the signal used to control the times at which measurements are performed on a data signal will be referred to herein as the "detection signal". However, the particular examples discussed below will be in terms of a periodic detection signal and will be referred to as a clock signal. Because in each of these cases, measurement times are initiated in response to the clock signal, it is important to detect whether the clock signal transitions occur within the interval around the data transitions determined by the Setup time and the Hold time.

The timing of data transitions relative to clock transitions can vary depending on which test point in a unit under test is being tested. For example, in the HP 3060 Board Test System by Hewlett-Packard Company, contact is made from the HP 3060 to a circuit board under test by means of bed-of-nails contact scheme. In that scheme each test point in the circuit board is contacted by one of a set of test probes in the HP 3060. Therefore, the data gathered at the various test points are subject to relative delays caused by differences in signal delays within the circuit board under test in reaching the test point at which the signal is tested. This measured data is subject to further relative delays because of the variation in delays among the various circuit paths within the HP 3060. Therefore the detected data at each of the data points can have differing delays relative to the clock signal, so that data at some test points can be accurately tested even though data at other test points is inaccurately tested. It is therefore important to check the timing of the data transitions in each data stream from each of the test points relative to the clock transitions.

In accordance with the disclosed preferred embodiment of the invention, the incidence of the undesired near coincidence of clock and data transitions is detected by first producing from the data signal a supplementary signal having pulses in synchronism with the transitions in the data signal. Each of these pulses has a width $T_1+T_2$ (where $T_1$ is the time after a data transition in which a repeatable measurement can't be initiated and $T_2$ is the time before a data transition in which a repeatable measurement can't be initiated) equal to the width of the window about each transition in which measurements should not be performed. The near coincidence of clock and data transitions is checked by delaying the clock signal by the time $T_2$ and then checking whether the clock signal executes during any of the pulses a transition on which data measurements are triggered. If such a transition does occur during a pulse in the supplementary signal then a flag is set to apprise the user of that occurrence. When a near coincidence occurs, the person testing the unit under test can select a fixed delay $T_d$ by which the clock signal is delayed to eliminate the near coincidence.

DESCRIPTION OF THE PREFERRED EMBODIMENT

Figure 1:
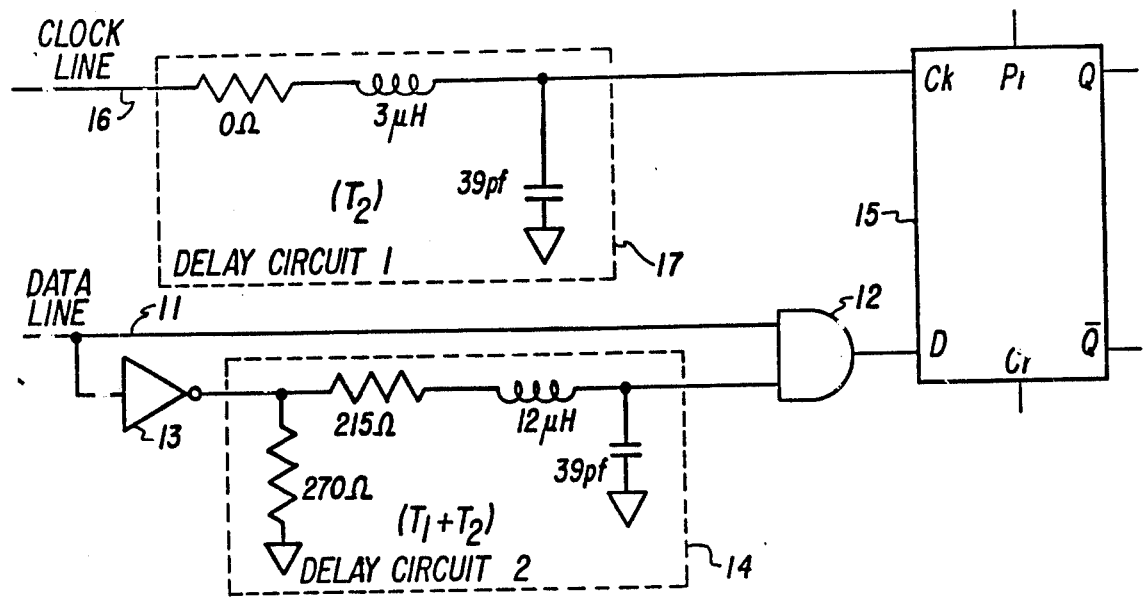
FIG. 1 shows a circuit suitable for detecting a clock trigger edge within the window about a low-to-high data transition defined by the Setup and Hold times.

In FIG. 1 is shown a circuit suitable for detecting the near coincidence of a trigger edge of a clock signal and a low-to-high transition of a data line.

Figure 2:
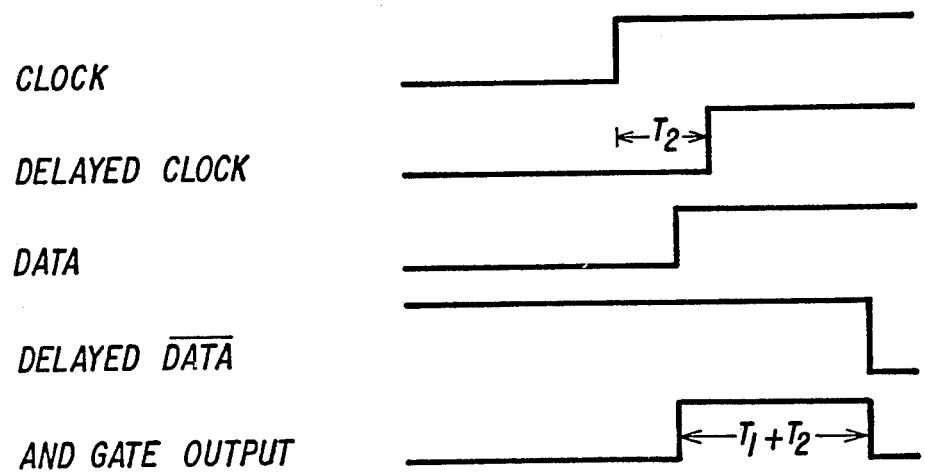
FIG. 2 is a timing diagram for the circuit of FIG. 1.

A data signal is applied to data line 11 which is connected to one input of a 2-input AND gate 12. The data signal is also inverted by an inverter 13 and then delayed by a delay circuit 14 to produce a delayed data signal which is applied to the second input of AND gate 12. The output signal of the AND gate is only high when the data signal and the delayed data signal are both high—the relationship between these three signals is illustrated in FIG. 2.

The output signal of the AND gate is applied to the D input of an edge sensitive D-type flip-flop 15. The clock signal is applied to a clock line 16 which is connected through a delay circuit 17 to the clock input of flip-flop 15. The relationship between the delayed clock signal and the output signal of AND gate 12 is shown in FIG. 2. In that figure it is assumed that measurements are made in response to the low-to-high transition of the clock signal so that the edge sensitive flip-flop is selected to respond to the low- to-high transition of the signal at its clock input Ck. In the opposite case in which measurements are initiated in response to a high-to-low transition of the clock signal, flip-flop 15 is also selected to be responsive to the high-to-low transition of the signal at its clock input Ck.

The components of delay circuit 14 and 17 are selected to produce delays of $T_1+T_2$ and $T_2$ respectively. This choice of delays will make the delayed clock signal occur during the pulse in the output signal of AND gate 12 only if the clock signal occurs within a time $T_1$ after the data transition or within a time $T_2$ before the data transition thereby initiating a measurement during the window about a data transition in which repeatable measurements can't be initiated.

Figure 3:
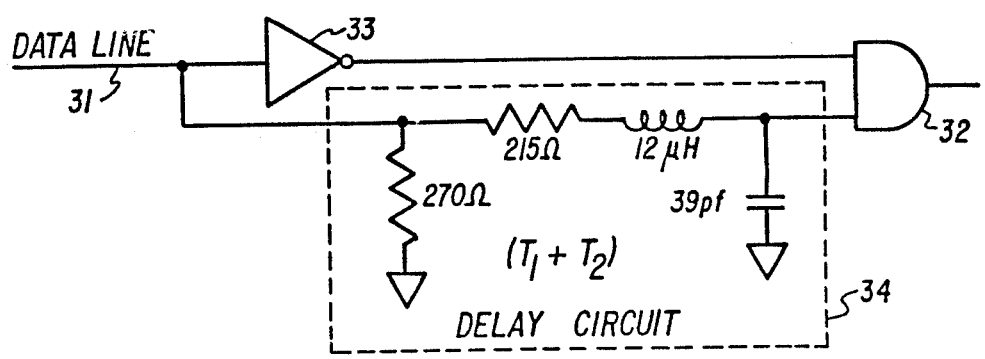
FIG. 3 shows a circuit suitable for producing pulses of length $T_1+T_2$ in response to negative transitions of a data signal.
Figure 4:
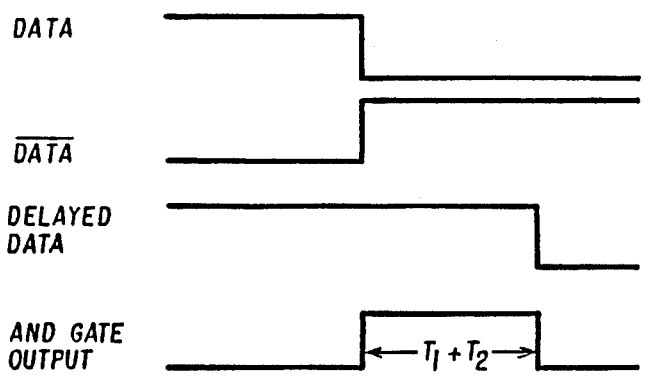
FIG. 4 is a timing diagram for the circuit of FIG. 3.

It should be noted that the combination of elements 11, 12, 13 and 14 will produce a pulse only for low-to-high data transitions. In order to produce a pulse for high-to-low transitions, the combination of elements 11-14 in FIG. 1 should be replaced by the combination of elements 31-34 in FIG. 3. In that circuit the data signal is applied on a data line 31 which is connected through an inverter 33 to one input of an AND gate 32. The data signal is also passed through a delay circuit 34 to the other input of AND gate 32. FIG. 4 shows the signals which result in this circuit from the application of the data signal to data line 33.

The circuit shown in FIG. 1 enables the detection of a clock transition near a low-to-high data transition. The substitution of the circuit in FIG. 3 for the combination of elements 11-14 in FIG. 1 enables the detection of clock transitions near a high-to-low data transition. Alternatively, the output of AND gate 12 and AND gate 32 could be applied to the inputs of a 2 input OR gate to produce a supplementary signal having pulses at both types of data transitions. The application of this supplementary signal to the D input of flip-flop 15 would enable the detection of clock transitions near either type of data transition.

Figure 5:
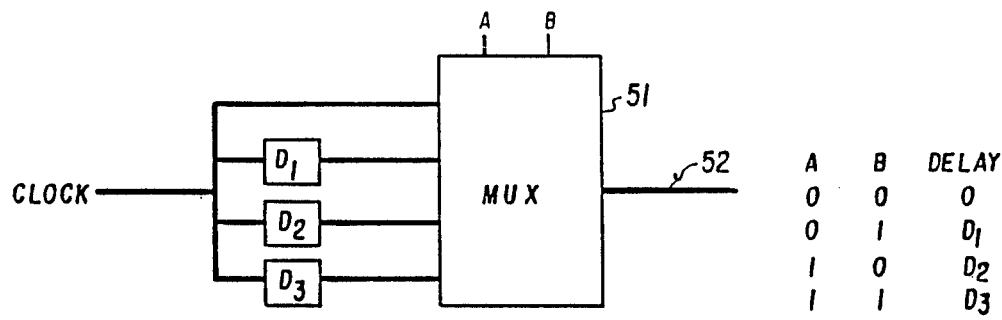
FIG. 5 shows a variable delay circuit suitable for delaying a signal by a user selectable amount.

When an undesired near coincidence of clock and data transitions is detected, the problem can be alleviated by generating a delay of one signal relative to the other. Since this problem can occur for any of the data lines, it is easier to insert a variable delay circuit into the clock line than to insert a variable delay circuit into each of the data lines. One choice of a variable delay circuit is shown in FIG. 5 in which a clock signal is passed through 4 parallel paths having inserted delays of O, $D_1$, $D_2$, and $D_3$ respectively. In response to user control, a pair of control signals A and B select which of the input lines to Multiplexer 51 is connected to output line 52. Initially, the A and B inputs are both zero to select zero delay. If appear coincidence is detected then the delay is changed to $D_1$. If the near coincidence persists then $D_2$ is selected and finally if $D_2$ is inadequate then $D_3$ is selected.

In general, in any given test, a data line from each of several test points will supply data. Since each line can have different delays relative to the clock signal, near coincidence might occur for some lines but not others. The choice of more than 2 selections for clock delay improves the chance that one of the choices will eliminate near coincidences for all data times. If in a given test the 4 choices of delay provided by the circuit in FIG. 4 are not sufficient to remove near coincidences of all data and clock transitions, then several alternatives can be employed to accurately test all of the test points. In one alternative, the number and/or range of delays can be increased. In a second alternative, variable delays can be inserted in some or all of the data lines. In a third alternative, only data on lines having no near coincidences will be processed when the choice of delay is zero. Then when the delay is changed to $D_1$, only those lines which have not been tested and which now have no near coincidences will be tested. If some lines again show near coincidences then this step will be repeated with $D_2$ and then if necessary also with $D_3$. For a tester which is constructed to handle clock rates up to 10 megaherz (i.e. clock periods greater than 100 nsec), a useful choice for $D_1$, $D_2$ and $D_3$ is 30, 60 and 90 nsec respectively. Typical values for the $T_1$ and the time $T_2$ are 30 nsec and 20 nsec respectively so that this selection of delays should enable near coincidences with the clock signal transitions of transitions on any given data line to be eliminated.

Figure 6:
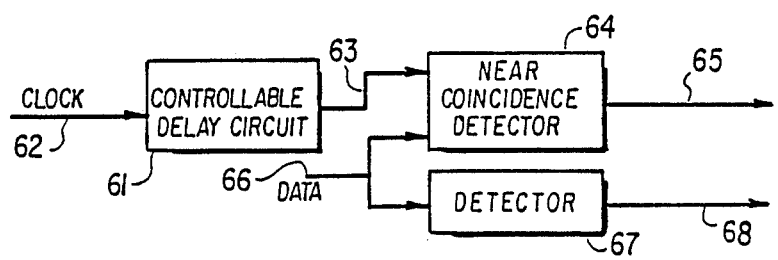
FIG. 6 is a block diagram of a circuit tester capable of detecting whether a clock trigger edge is within a window about a data transition defined by the Setup and Hold times.
Figure 7:
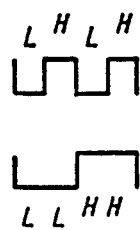
FIG. 7 shows input signals suitable for testing an AND gate to produce an expected output signal.
Figure 7:
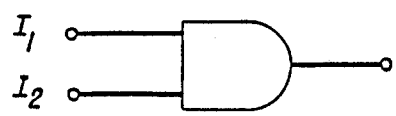
Figure 7:
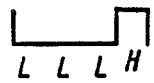
Figure 8:
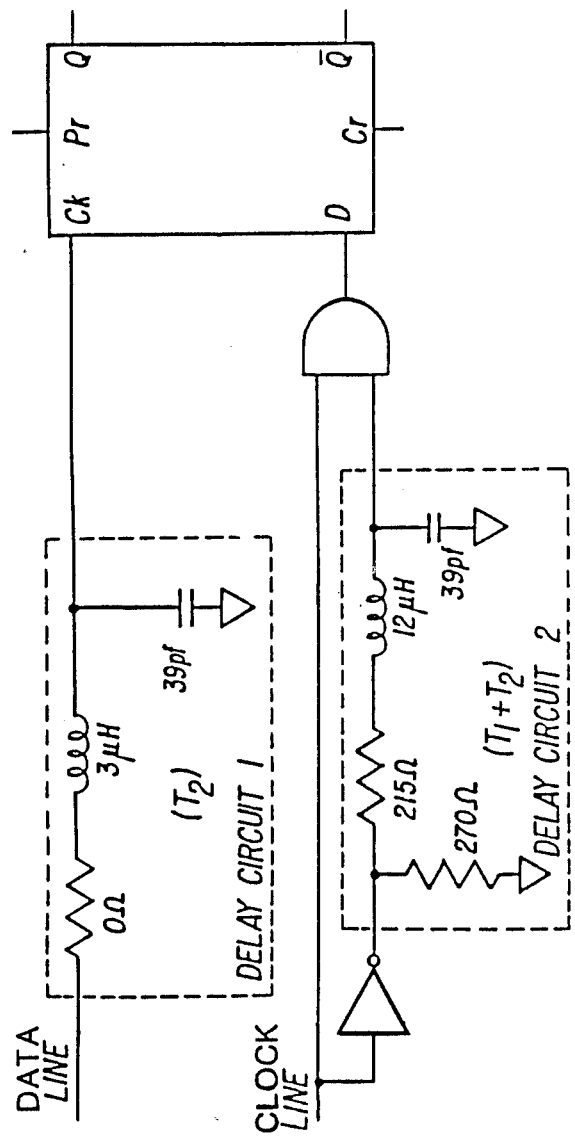
FIG. 8 is a block diagram of a circuit tester capable of detecting whether a data transition is within a window about a clock trigger edge defined by the Setup and Hold times.
Figure 9:
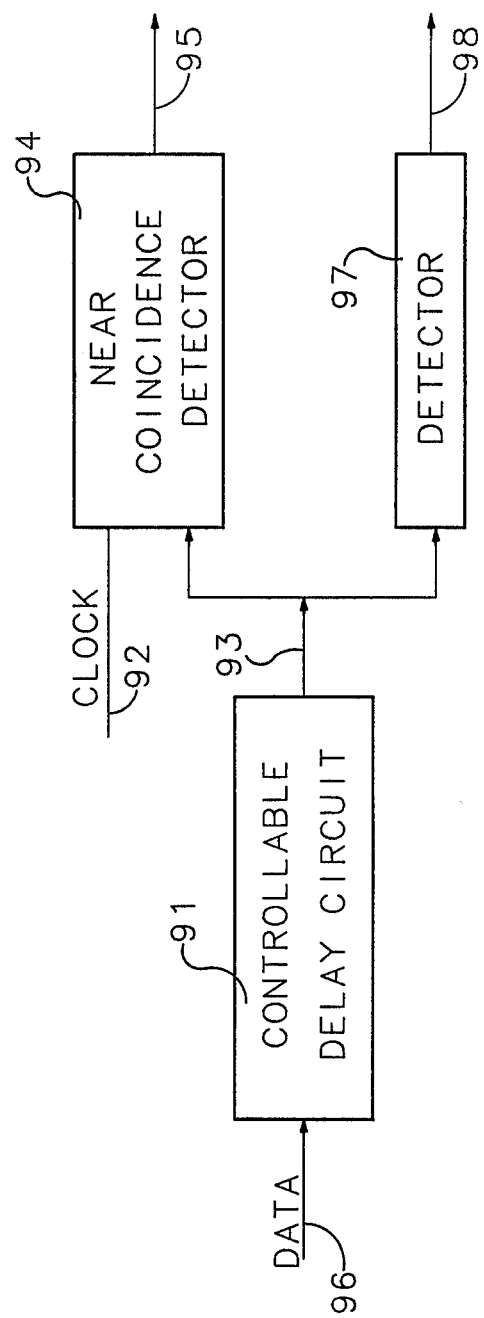
FIG. 9 is a block diagram of a circuit tester in which a data signal can be delayed by a controlled amount to eliminate an unwanted near coincidence of a clock trigger edge and transitions in the data signal.

In FIG. 6 is shown a data tester containing a near coincidence detector 64 like the circuit shown in FIG. 1 and a controllable delay circuit 61 like the circuit shown in FIG. 5. A clock signal used to control the times at which data is detected is applied on an input 62 to produce a delayed clock signal 63. Near coincidence detector produces on line 65 a signal indicating whether any trigger edges in the delayed clock signal occur within a window defined by the Setup and Hold times about transitions in data applied on a data input 66. A detector 67 is utilized to detect the data and provide an output signal on output 68.

We claim:

1. A circuit for use in a circuit tester, said circuit comprising:
   a first input on which a data signal is to be applied;
   a second input on which a detection signal is to be applied, said detection signal indicating the times at which detection of said data signal is initiated;
   coincidence means, connected to the first and second inputs and responsive to the data signal and the detection signal, for detecting whether a time at which detection of the data signal is initiated occurs within a hold time prior to the initiation of a transition of the data signal or a setup time subsequent to the initiation of a transition of the data signal;
   said setup time being the length of the interval immediately succeeding the initiation of a transition in the data signal in which accurate detection of the data signal cannot be made if the detection is initiated within that interval and said hold time being the length of the interval immediately succeeding the initiation of detection of the data signal in which accurate detection of the data signal cannot be made if the data signal makes a subsequent transition in thes hold time interval;
   wherein each time at which said data signal is to be detected is indicated by a trigger edge in the detection signal and wherein said coincidence means comprises:
   means, responsive to the data signal, for producing a first signal having at each transition of the data signal a pulse of duration equal to the sum of the setup and hold times; and
   means for producing from the detection signal a delayed detection signal which has trigger edges delayed by a fixed amount relative to the trigger edges in the detection signal, said fixed amount of delay being selected so that a trigger edge of the delayed detection signal occurs during one of the pulses if and only if a trigger edge of the detection signal occurs within a setup time after a transition in the data signal or within a hold time begore a transition in the data signal; and
   means, responsive to said first signal and responsive to the delayed detection signal, for detecting whether a trigger edge in the delayed detection signal occurs during one of the pulses in the first signal.

2. A circuit as in claim 1 further comprising: means, connected to the first input, for delaying the signal on said first input, whereby a signal on said first input can be delayed to remove a near coincidence.

3. A circuit as in claim 1 further comprising: means, connected to the second input, for delaying the signal on said second input, whereby a signal on said second input can be delayed to remove a near coincidence.

4. A circuit for use in a circuit tester, said circuit comprising:
   a first input on which a data signal is to be applied;
   a second input on which a detection signal is to be applied, said detection signal indicating the times at which detection of said data signal is initiated;
   coincidence means, connected to the first and second inputs and responsive to the data signal and the detection signal, for detecting whether a time at which detection of the data signal is initiated occurs within a hold time prior to the initiation of a transition of the data signal or a setup time subsequent to the initiation of a transition of the data signal;
   said setup time being the length of the interval immediately succeeding the initiation of a transition in the data signal in which accurate detection of the data signal cannot be made if the detection is initiated within that interval and said hold time being the length of the interval immediately succeeding the initiation of detection of the data signal in which accurate detection of the data signal cannot be made if the data signal makes a subsequent transition in these hold this hold time interval;
   wherein each time at which said data signal is to be detected is indicated by a trigger edge in the detection signal and wherein said coincidence means comprises:
   means, responsive to the detection signal, for producing a second signal having at each trigger edge of the detection signal a pulse of duration equal to the sum of the setup and hold times; and
   means for producing from the data signal a delayed data signal which has transitions delayed by a fixed amount relative to the transitions in the data signal, said fixed amount of delay being selected so that a transition of the delayed data signal occurs during one of the pulses if and only if a trigger edge of the detection signal occurs within a setup time after a transition in the data signal or within a hold time before a transition in the data signal; and
   means, responsive to said second signal and responsive to the delayed data signal, for detecting whether a transition in the delayed data signal occurs during one of the pulses in the second signal.

5. A circuit as in claim 4 further comprising:

means, connected to the first input, for delaying the signal on said first input, whereby a signal on said first input can be delayed to remove a near coincidence.

6. A circuit as in claim 4 further comprising:
means, connected to the second input, for delaying the signal on said second input, whereby a signal on said second input can be delayed to remove a near coincidence.

* * * * *